United States Patent [19]

Sudo et al.

[11] Patent Number: 4,949,163

[45] Date of Patent: Aug. 14, 1990

[54] SEMICONDUCTOR INTEGRATED CIRCUIT DEVICE PARTICULARLY FOR HIGH SPEED LOGIC OPERATIONS

[75] Inventors: Toshio Sudo, Kawasaki; Chiaki Takubo, Yokohama, both of Japan

[73] Assignee: Kabushiki Kaisha Toshiba, Kanagwa, Japan

[21] Appl. No.: 181,084

[22] Filed: Apr. 13, 1988

[30] Foreign Application Priority Data

Apr. 15, 1987 [JP] Japan ................... 62-92291

[51] Int. Cl.[5] ............... H01L 23/48; H01L 23/02; H01L 39/02
[52] U.S. Cl. ......................... 357/80; 357/71; 357/74; 333/247
[58] Field of Search ............... 357/74, 80, 71; 333/247

[56] References Cited

U.S. PATENT DOCUMENTS 4,751,482 6/1988 Fukuta et al. ................. 357/74

FOREIGN PATENT DOCUMENTS

| 0198698 | 10/1986 | European Pat. Off. ........... 333/247 |
| 5832786 | 12/1978 | Japan . |
| 55-86144 | 6/1980 | Japan ................... 357/74 |
| 60-49660 | 3/1985 | Japan . |
| 61-230560 | 10/1986 | Japan . |

Primary Examiner—J. Carroll
Attorney, Agent, or Firm—Helfgott & Karas

[57] ABSTRACT

The semiconductor integrated circuit device of high speed operation can be obtained by adopting the feed-through termination system and by making the wiring pattern in that case as being of construction folded in the direction of thickness of the supporting circuit substrate, without increasing the housing density of the outer lead. In addition, since matching resistor is mounted on the external wall of the substrate, the manufacturing process is also simple without the making the outside dimensions of the substrate large.

11 Claims, 2 Drawing Sheets

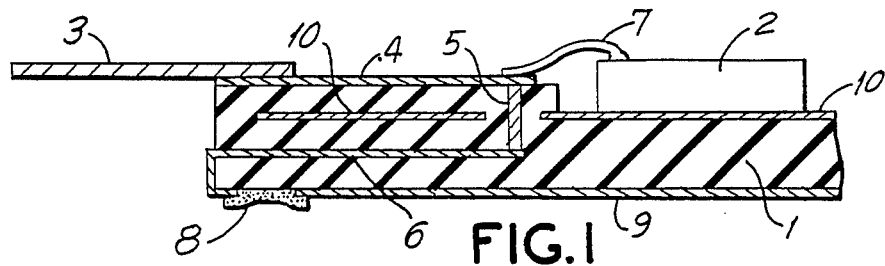
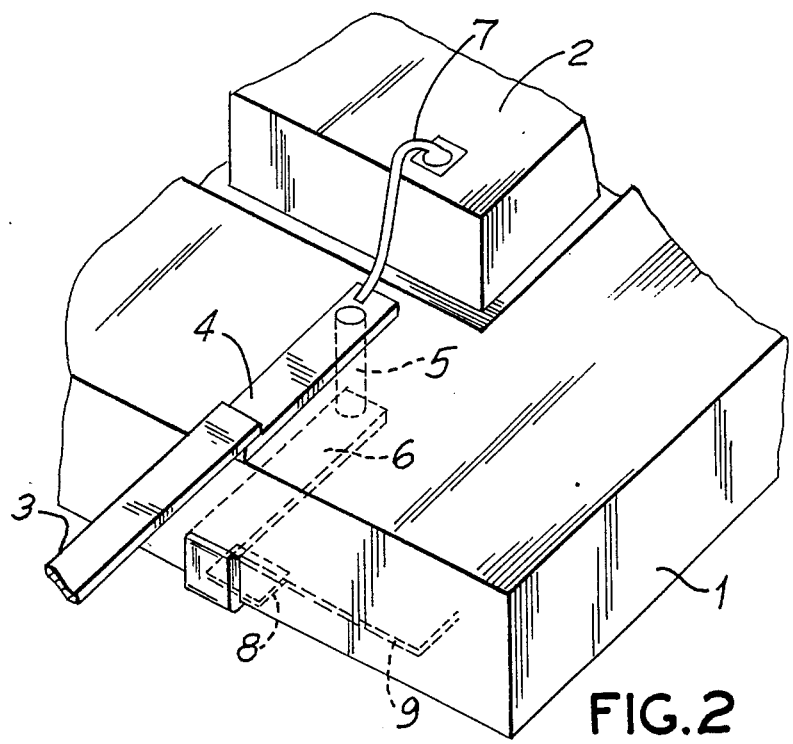
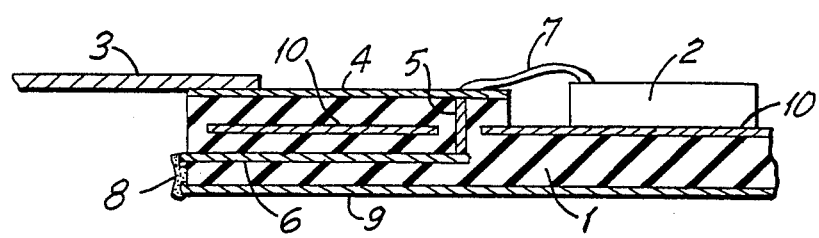
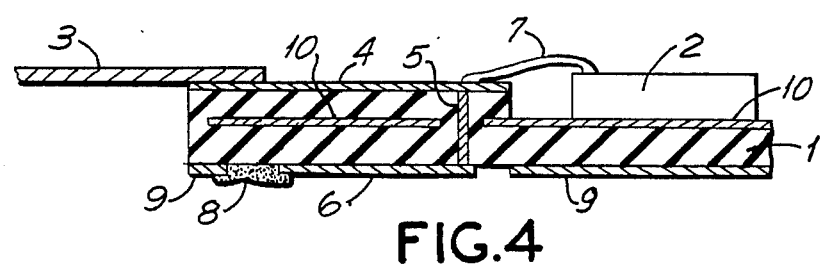

4,949,163

SEMICONDUCTOR INTEGRATED CIRCUIT DEVICE PARTICULARLY FOR HIGH SPEED LOGIC OPERATIONS

BACKGROUND OF THE INVENTION

The present invention relates to a semiconductor integrated circuit device, and relates in particular to a supporting substrate construction appropriate for a high speed circuit.

In recent years, the development of compound semiconductor elements to carry out high speed logic operations in the field of semiconductor integrated circuits has become active. For example, an electric field effect transistor (FET) employing a GaAs semiconductor wafer, which carry out a high speed switching operation in approximately 100 psec, has been obtained. The integrated chip of the integrated circuit devices which carry out such high speed operation are composed within a conventional package. These devices have a problem in that high speed performance in the integrated circuit itself cannot be obtained. Various causes of the deterioration of high speed performance have been considered. One of these causes has been attributed a difficulty in matching termination of the high speed input signal to the circuit.

For example, in the case of the high speed input signal is launched into a FET of an input section within the GaAs integrated circuit through a transmission line, the high speed input signal is reflected almost completely, and interferes with the input signal because the input impedance of the FET is high. As a result, waveform distortion is occurred. Normally, to prevent this, termination using a matching resistor is carried out. FIG. 6a is an equivalent circuit of an example of a termination construction. A matching resistor 12, having the same value as the characteristic impedance of a transmission line 11, is arranged close to the input lead of a package 14. The package 14 normally includes a substrate, a semiconductor chip, wiring patterns and a lid for sealing. For example, in an ECL circuit employing a silicon substrate and having a switching speed of approximately 1 nsec, the problems caused by the reflection of input signal have been prevented by mounting the matching resistor on the outside of the package.

However, if the switching speed is approximately 100 psec, the wiring distance in FIG. 6a from point A of the package outside to the input terminal B of the integrated circuit chip 13 packed therein, becomes a serious problem. This wiring portion between A and B is called an open stub, and when it is increased in length, the actual input signal to the integrated circuit chip 13 is of a ringing waveform. As a result, the input signal causes a mis-operation of the chip 13. To prevent this, in principle, it should be enough to accommodate the matching resistor using a thick film printing technique or a chip resistor within the package as close to chip as possible.

However, it is difficult to form a resistor within a substrate having an uneven surface using the thick film printing technique. Further, a chip resistor occupies a considerably larger space within the package, which increases the size of the overall device.

FIG. 6b is an example of another termination construction. This is called "feed-through termination". In this construction, the input signal is launched to wiring pattern 15 on the substrate of the package 14 from the outer lead 11 through the input section of integrated circuit chip 13, and is terminated by the matching resistor 12. In this construction, there is no need to arrange the matching resistor close by the chip 13, and there is no problem if the wiring distance from the point A to the point C is long. However, in the abovementioned conventional construction, it is necessary two ports corresponding to the only one input signal.

As described above, as the matching termination method in the input section of the integrated circuit of high speed operation, the method to take the termination on the front of the chip causes the problems of the open stub, and feed-through termination requires two ports.

SUMMARY OF THE INVENTION

Accordingly, one object of this invention is to provide an improved semiconductor integrated circuit device, having an improved impedance matching termination construction at the signal input section of the semiconductor integrated circuit device for high speed operation.

Briefly, in accordance with one aspect of this invention, a semiconductor integrated circuit device comprises a semiconductor integrated circuit chip, insulating substrate means for supporting the chip, outer lead means for supplying a high speed input signal to the device, first wiring pattern means for connecting the outer lead means to an input terminal of the semiconductor integrated circuit chip, second wiring pattern means formed at least partially within the insulating substrate means and connected to the first wiring pattern means close by the semiconductor circuit chip, impedance matching means formed on the surface of the substrate and connected to the second wiring pattern means, and terminating potential applying means connected to the impedance matching means.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a cross sectional plan view illustrating an embodiment of this invention;

FIG. 2 is a perspective view of the embodiment of FIG. 1;

FIG. 3 is a cross sectional plan view illustrating another embodiment of this invention;

FIG. 4 is a cross sectional plan view illustrating a more another embodiment of this invention.

DESCRIPTION OF THE PREFERRED EMBODIMENTS

Figure 5A:
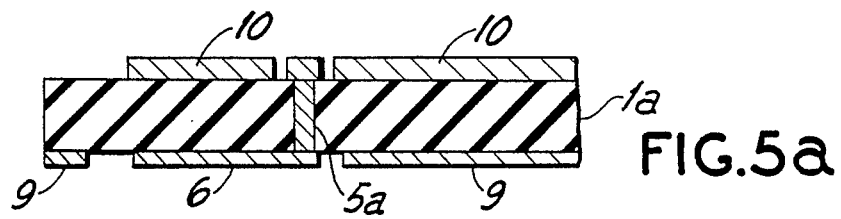
FIGS. 5a to 5b are cross sectional plan views illustrating manufacturing steps of the embodiment of FIG. 4.

Hereinafter, the embodiments of the present invention will be explained.

FIG. 1 shows a cross sectional construction of an important part of a circuit substrate of an embodiment of this invention. FIG. 2 is a perspective view of FIG. 1. A GaAs logic semiconductor integrated circuit chip 2 is mounted on the surface of a ceramic supporting circuit substrate 1 of a package. A portion of a first conductive layer 10 applied the die potential is exposed on a chip mounting section of supporting circuit substrate 1 and a portion is buried within the substrate 1. Wiring layers are placed on the circumference, and an outer lead 3 is joined to an external circumference section of the supporting circuit substrate 1.

The outer lead 3, shown in FIGS. 1 and 2 is a lead to launch the input signal to the chip 2, and is connected to the input terminal of the chip 2 through the first wiring pattern 4 provided on the surface of the supporting circuit substrate 1 and through a bonding wire 7. A second wiring pattern 6 is buried within the supporting circuit substrate 1 in parallel with the first wiring pattern 4. A portion of the first conductive layer 10 is also buried within the supporting circuit substrate 1 to control the characteristic impedance of the first wiring pattern 4. Also, the first conductive layer 10 is extended to under the chip 2. One end of the first wiring pattern 4 is connected to outer lead 3, and other end is connected to the second wiring pattern 6 through a bridge portion 5 near the input terminal of the chip 2. A second conductive layer 9 is composed on the bottom surface of the supporting circuit substrate 1.

Thus, the first wiring pattern 4 is formed in a microstrip configuration by the first conductive layer 10 and the second wiring pattern 6. The second wiring pattern 6 is formed in a strip line configuration by the first and second conductive layers 10 and 9. The characteristic impedance of the second wiring pattern 6 is controlled by the first and second conductive layers 10 and 9. Each line has a constant characteristic impedance (for example, 50 ohms).

The one end of the second wiring pattern 6 is exposed on the side wall of the substrate 1, and extends over the surface to the bottom of the substrate 1. The matching resistor 8 is fabricated on the bottom of the supporting circuit substrate 1. The one end of the matching resistor 8 is connected to the end of the exposed portion of the second wiring pattern 6. The other end of the matching resistor 8 is connected to the second conductive layer 9 having the termination voltage. The matching resistor 8 is formed of thick film paste before attaching of the outer lead 3.

An example will be explained below. The matching resistor 8 has a resistance of 50 ohms and both of the characteristic impedances of first wiring pattern 4 and second wiring pattern 6 are also controlled to be 50 ohms. The relative dielectric constant of the ceramic supporting circuit substrate 1 is approximately 10, and the width of the first wiring pattern 4 is 200 μm and the thickness between the first wiring pattern 4 and the first conductive layer 10 is also designed 200 μm. Further, the width of the second wiring pattern 6 in the strip line construction is also 120 μm, the thicknesses between the second conductive layer 9 and the second wiring pattern 6, and between the first conductive layer 10 and the second wiring pattern 6 are 200 μm, respectively.

Since the feed-through termination system has been utilized, there is neither the waveform distortion by the ringing, etc., in the input signal section, nor damage to the high performance of the GaAs integrated circuit chip. Further, since the first wiring pattern 4 and second wiring pattern 6 forming the feed-through wiring pattern have a folded construction in the direction of the thickness of the circuit substrate 1, there is no increase in the housing density of the outer lead. Compared with the conventional construction formed the matching resistor within the package, it is clear that the manufacturing process of the invention is simpler, and the outside dimensions of the package are not increased.

FIG. 3 shows the cross sectional construction of important parts of another embodiment of the present invention with reference numerals corresponding to FIG. 1. A different point from the first embodiment is that the matching resistor is formed on the side wall of the supporting circuit substrate 1. It is enough that matching resistor 8 in this case is formed, for example, simultaneously with the sintering of the circuit substrate employing using tungsten paste, etc., prior to mounting the outer lead 3. In this embodiment, a similar effect to the first embodiment can be obtained.

FIG. 4 shows the cross sectional construction of important parts of more another embodiment of the present invention with reference numerals corresponding to FIG. 1. Different points from first and second embodiments are that the bridge portion 5 is formed through the substrate I, the entire second wiring pattern 6 is placed on the bottom surface of the substrate I and the second conductive layer 9 is also formed the ring-shaped pattern on the bottom surface of the substrate.

Figure 5B:
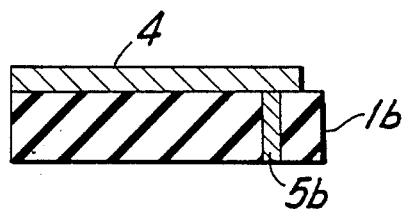
Figure 5C:
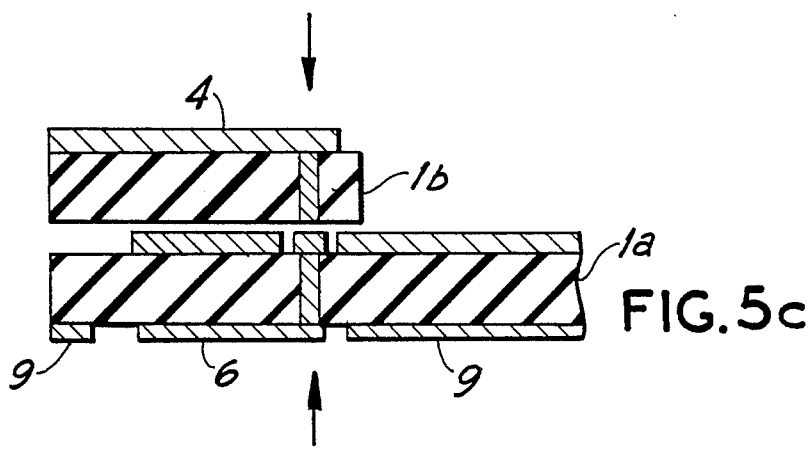
Figure 6A:
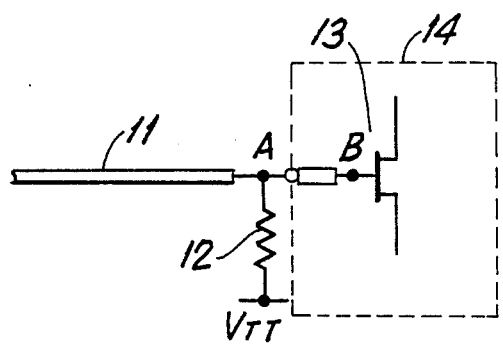
FIGS. 6a and 6b are equivalent circuit diagrams illustrating conventional circuits.
Figure 6B:
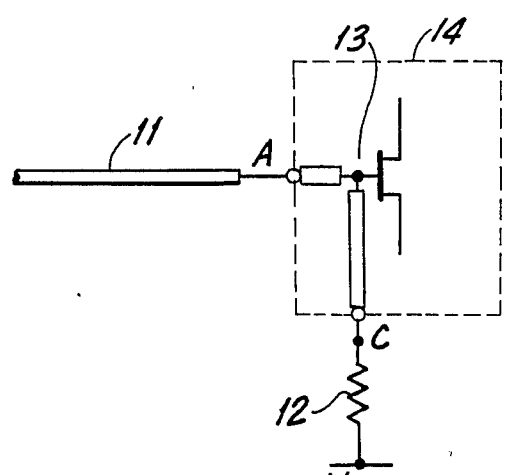

The manufacturing process of the embodiment of this invention shown in FIG. 4 is explained using FIGS. 5a to 5c. The first conductive layer 10 and the second conductive layer 9 are formed by screen printing technique on both surfaces of an lower ceramic substrate 1a (shown in FIG. 5a). The first wiring pattern 4 and the bridge portion 5 are formed on and within an upper ceramic substrate 1b (shown in FIG. 5b). The bridge portion 5 is formed by filling up the conductive paste within a hole. Each lower and upper ceramic substrates 1a and 1b are laminated, pressed and sintered (shown in FIG. 5c). As a result, both substrates 1a and 1b are unified. Thereafter, the outer lead, the matching resistor and the chip are formed on the sintered ceramic substrate.

The present invention shall not be limited to the said embodiments. For example, in the embodiments, the case of composing the GaAs logic integrated circuit chip was explained, but the present invention is also effective when other high speed integrated circuit chips are used.

Incidentally in the embodiments the connection between the integrated circuit chip and the supporting circuit substrate was carried out by means of wire bonding. The present invention may be similarly applied to connections by means of TAB (Tape Automated Bonding), etc. Further, it is not always necessary the conductive layers 9 and 10 supplying the reference potential and the termination potential are formed on the entire surface.

In addition, the present invention may be realized various other arrangements which are similar to those illustrated.

According to the present invention, by folding and placing the feed-through wiring pattern as a laminated construction in the direction of the thickness within the supporting circuit substrate of the package, feed-through type termination can be carried out without increasing the outer lead density. Since the matching resistor is directly mounted on the external wall of the substrate, there is no difficulty in the manufacturing process. Also, the outside dimensions of the package are not made larger. Therefore, according to the present invention, an integrated circuit device fully enabling high speed performance of high speed logic integrated circuit chips, etc., can be realized without the wrong influence from reflection of the input signal.

According to the present invention as described above, the integrated circuit device of high speed operation can be obtained in principle, by adopting the feed-through termination system and by making the wiring pattern being folded in the direction of thickness of the supporting circuit substrate. In addition, since the matching resistor is fabricated on the external wall of package, the manufacturing process is also simple, without making the outside dimensions of the package large. Then, the housing density of the outer lead is increased.

We claim:

1. A semiconductor integrated circuit device, comprising:
   an insulator substrate;
   a semiconductor integrated circuit chip having an input terminal and mounted on the substrate;
   a first wiring pattern element provided on the substrate;
   an outer lead connected to a first end of the first wiring pattern element;
   connecting means for connecting a second end of the first wiring pattern element to the input terminal of the chip;
   an electrical conducting bridge provided in the substrate and extending perpendicularly to the first wiring pattern element and being connected at one end thereof to the first wiring pattern element;
   a second wiring pattern element having at least a portion and extending parallel to the first wiring pattern element, the second wiring pattern element having a first and second end and being connected at the first end thereof to another end of the bridge; and
   an impedance matching element provided on the substrate and being connected to the second end of the second wiring pattern element.

2. The semiconductor integrated circuit device of claim 1 wherein the second wiring pattern element includes a first portion substantially perpendicular to the first wiring pattern element and a second portion parallel to the first wiring pattern element.

3. The semiconductor integrated circuit device of claim 2 wherein the second portion is formed within the substrate.

4. The semiconductor integrated circuit device of claim 2 wherein the second portion is partially formed in the substrate.

5. The semiconductor integrated circuit device of claim 1 wherein the impedance matching element includes a resistor.

6. The semiconductor integrated circuit device of claim 1 wherein the first wiring pattern element has an impedance substantially equal to an impedance of the second wiring pattern element.

7. The semiconductor integrated circuit device of claim 1, wherein the insulating substrate is formed of ceramic material.

8. The semiconductor integrated circuit device of claim 2 wherein the substrate has a side wall and a bottom wall.

9. The semiconductor integrated circuit device of claim 8 wherein the impedance matching element is provided on the side wall of the substrate.

10. The semiconductor integrated circuit device of claim 8 wherein the impedance matching element is supported on the bottom wall of the substrate.

11. The semiconductor integrated circuit device of claim 8 wherein the connecting means includes a bonding wire.

* * * * *